United States Patent
Cho

(10) Patent No.: US 8,363,507 B2
(45) Date of Patent: Jan. 29, 2013

(54) WORDLINE DRIVER, MEMORY DEVICE INCLUDING THE SAME AND METHOD OF DRIVING A WORDLINE

(75) Inventor: Yong-Ho Cho, Suwon-si (KR)

(73) Assignee: Samsung Electronics Co., Ltd., Samsung-ro, Yeongtong-gu, Suwon-si, Gyeonggi-do (KR)

(*) Notice: Subject to any disclaimer, the term of this patent is extended or adjusted under 35 U.S.C. 154(b) by 116 days.

(21) Appl. No.: 12/820,244

(22) Filed: Jun. 22, 2010

(65) Prior Publication Data

US 2011/0032785 A1    Feb. 10, 2011

(30) Foreign Application Priority Data

Aug. 6, 2009 (KR) .................. 10-2009-0072213

(51) Int. Cl.
*G11C 8/00* (2006.01)

(52) U.S. Cl. ......... 365/230.06; 365/189.09; 365/189.11; 365/185.23

(58) Field of Classification Search ............. 365/230.06, 365/230.03, 189.08, 189.09, 189.11, 185.23
See application file for complete search history.

(56) References Cited

U.S. PATENT DOCUMENTS

| | | | |
|---|---|---|---|
| 6,657,915 B2 * | 12/2003 | Seo et al. ................. | 365/230.06 |
| 6,868,034 B2 * | 3/2005 | La et al. .................... | 365/238.5 |
| 7,248,535 B2 * | 7/2007 | Chun ........................ | 365/230.03 |
| 7,551,513 B2 * | 6/2009 | Yoon et al. ............... | 365/230.06 |
| 2009/0040851 A1 * | 2/2009 | Mori et al. ................ | 365/201 |

FOREIGN PATENT DOCUMENTS

| | | |
|---|---|---|
| KR | 10-2000-0045415 | 7/2000 |
| KR | 10-2000-0066347 | 11/2000 |
| KR | 10-2001-0003913 | 1/2001 |

* cited by examiner

*Primary Examiner* — Kretelia Graham
(74) *Attorney, Agent, or Firm* — Muir Patent Consulting, PLLC

(57) ABSTRACT

A wordline driver includes a pre-driver, a sub-wordline driver and a transmission circuit. The pre-driver generates a wordline enable signal and a wordline disable signal based on one or more selection signals, a decoded address signal, and one or more timing control signals. The transmission circuit transmits the wordline enable signal and the wordline disable signal. The sub-wordline driver controls a voltage level of the sub-wordline based on the wordline enable signal and the wordline disable signal that are transmitted by the transmission circuit. Therefore, driving capacity may be improved.

10 Claims, 8 Drawing Sheets

WORDLINE DRIVER, MEMORY DEVICE INCLUDING THE SAME AND METHOD OF DRIVING A WORDLINE

CROSS-REFERENCE TO RELATED APPLICATION(S)

This application claims priority under 35 USC §119 to Korean Patent Application No. 10-2009-0072213, filed on Aug. 6, 2009, in the Korean Intellectual Property Office (KIPO), the contents of which are incorporated herein in their entirety by reference.

BACKGROUND

1. Technical Field

Example embodiments relate to a memory device, and more particularly to a wordline driver, a memory device including a wordline driver and a method of driving wordlines in a memory device.

2. Description of the Related Art

In general, a memory device for storing data includes a memory cell array where a relatively large number of memory cells are arranged. For storing data into the memory device or reading the stored data from the memory device, a portion of the memory cells are selected based on an address signal, and data are stored in or read from the selected memory cells.

Each of the memory cells is coupled to a wordline and a bitline. To perform write and read operations, one wordline is activated or enabled to select the memory cells coupled to the enabled wordline. A wordline driver is needed to select a wordline and drive the selected wordline to a voltage level of an active logic level.

As degree of integration and storage capacity of the memory device increase, resistance and parasitic capacitance of transmission lines such as wordlines also increase, and thus a wordline driver having higher current-driving capacity is required. To optimize the length of a wordline and to improve the performance of the memory device, a hierarchical wordline structure which is composed of main wordlines and sub-wordlines may be adopted.

SUMMARY

Some example embodiments provide a wordline driver that may efficiently control timings of a wordline enable signal and a wordline disable signal.

Some example embodiments provide a memory device having a hierarchical wordline structure.

Some example embodiments provide a method of driving wordlines to efficiently control timings of a wordline enable signal and a wordline disable signal.

According to some example embodiments, a wordline driver includes a pre-driver, a sub-wordline driver and a transmission circuit. The pre-driver generates a wordline enable signal and a wordline disable signal based on one or more selection signals, a decoded address signal, and one or more timing control signals. The transmission circuit transmits the wordline enable signal and the wordline disable signal. The sub-wordline driver controls a voltage level of a sub-wordline based on the wordline enable signal and the wordline disable signal that are transmitted by the transmission circuit.

The pre-driver may control independently transition time points of the wordline enable signal and the wordline disable signal, in response to the one or more timing control signals.

The pre-driver may activate a sub-wordline by transiting the wordline enable signal to an active logic level after transiting the wordline disable signal to an inactive logic level.

The pre-driver may deactivate a wordline by transiting the wordline disable signal to an active logic level after transiting the wordline enable signal to an inactive logic level, in response to the one or more timing control signals.

The pre-driver may includes a logical operation circuit, a wordline enable signal output circuit and a wordline disable signal output circuit. The logical operation circuit generates a first combination signal and a second combination signal by performing a logical operation upon a first selection signal of the one or more selection signals, the decoded address signal, and a first timing control signal of the one or more timing control signals. The wordline enable signal output circuit provides the wordline enable signal based on a second selection signal of the one or more selection signals, the first combination signal, and the second combination signal. The wordline disable signal output circuit provides the wordline disable signal based on the second combination signal and a second timing control signal of the one or more timing control signals.

The wordline enable signal may be deactivated at a deactivation time point of the first timing control signal. The wordline disable signal may be activated at a deactivation time point of the second timing control signal. The deactivation time point of the second timing control signal may be controlled independently of the first timing control signal.

The transmission circuit may include a repeater. In one embodiment, the repeater amplifies the wordline enable signal and transmits the amplified wordline enable signal to the sub-wordline driver. The transmission circuit may transmit the wordline disable signal to the sub-wordline driver without amplification.

The sub-wordline driver may include a wordline activation circuit and a wordline deactivation circuit. The wordline activation circuit may increase a voltage level of the wordline up to a first power supply voltage while the wordline enable signal has an active logic level. The wordline deactivation circuit may stabilize the voltage level of the wordline at a second power supply voltage while the wordline disable signal has an active logic level. In one embodiment, the wordline deactivation signal circuit may be turned on after the wordline activation circuit is turned off in response to the wordline enable signal and the wordline disable signal.

According to some example embodiments, a memory device includes a plurality of sub-cell arrays, a pre-driver, a transmission circuit and a sub-wordline driver. The plurality of sub-cell arrays are coupled to a plurality of sub-wordlines and partitioned into a plurality of areas. The pre-driver generates a wordline enable signal and a wordline disable signal for driving the plurality of sub-wordlines based on one or more selection signals, a decoded address signal, and one or more timing control signals. The transmission circuit transmits the wordline enable signal and the wordline disable signal. The sub-wordline driver controls voltage levels of the plurality of sub-wordlines based on the wordline enable signal and the wordline disable signal.

The transmission circuit may include a repeater located in a conjunction area between two of the plurality of sub-cell arrays for amplifying the wordline enable signal to transmit the amplified wordline enable signal to the sub-wordline driver. The transmission circuit may transmit the wordline disable signal from the pre-driver to the sub-wordline driver without amplification.

In a method of driving a wordline in a memory device according to some example embodiments, a wordline enable signal and a wordline disable signal are generated based on one or more selection signals, a decoded address signal, and one or more timing control signals. The wordline enable signal and the wordline disable signal are transmitted. A voltage level of a sub-wordline is controlled based on the transmitted wordline enable signal and the transmitted wordline disable signal.

The wordline enable signal and the wordline disable signal may be generated by controlling independently a transition time point of the wordline enable signal and a transition time point of the wordline disable signal in response to the timing control signal.

The wordline enable signal may be transmitted to the sub-wordline driver with amplification and the wordline disable signal may be transmitted to the sub-wordline driver without amplification.

The wordline driver and the memory device according to some example embodiments may decrease power consumption and improve drive capacity by reducing the number of logic gates which are located in conjunction areas and are needed for transmitting the signals from the wordline driver to the wordline and for controlling timings of the wordline enable signal and the wordline disable signal.

BRIEF DESCRIPTION OF THE DRAWINGS

Illustrative, non-limiting example embodiments will be more clearly understood from the following detailed description taken in conjunction with the accompanying drawings.

DETAILED DESCRIPTION

Figure 1:
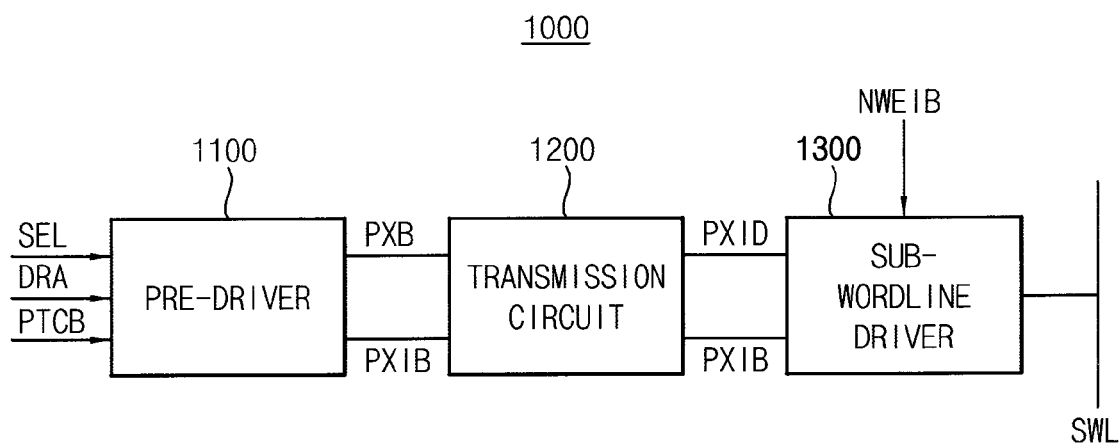
FIG. 1 is a block diagram illustrating a wordline driver according to some example embodiments.

Various example embodiments will be described more fully hereinafter with reference to the accompanying drawings, in which some example embodiments are shown. The present inventive concept may, however, be embodied in many different forms and should not be construed as limited to the example embodiments set forth herein. In the drawings, the layout and relative sizes of elements may be exaggerated for clarity. Like numerals refer to like elements throughout.

It will be understood that, although the terms first, second, third etc. may be used herein to describe various elements, these elements should not be limited by these terms. These terms are used to distinguish one element from another. Thus, a first element discussed below could be termed a second element without departing from the teachings of the present inventive concept. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular example embodiments only and is not intended to be limiting of the present inventive concept. As used herein, the singular forms "a," "an" and "the" are intended to include the plural forms as well, unless the context clearly indicates otherwise. It will be further understood that the terms "comprises," "comprising," "includes," and/or "including," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a block diagram illustrating a wordline driver according to some example embodiments.

Referring to FIG. 1, the wordline driver 1000 includes a pre-driver 1100, a transmission circuit 1200 and a sub-wordline driver 1300.

The pre-driver 1100 generates a wordline enable signal PXB and a wordline disable signal PXIB based on one or more selection signals SEL, a decoded address signal DRA, and one or more timing control signals PTCB.

In one embodiment, the one or more selection signals SEL may include one or more block selection signals to select a part of memory blocks in a memory cell array of a semiconductor memory device. The decoded address signal DRA may include a row address signal to select a sub-wordline SWL among a plurality of sub-wordlines that are simultaneously selected by a normal wordline enable signal NWEIB. The wordline driver 1000 may be used for the memory device having a hierarchical wordline structure in which one normal wordline (or one main wordline) and then one sub-wordline are selected based on a normal wordline enable signal, a selection signal and a decoded address signal. The above such signals to select a normal wordline and a sub-wordline may be generated based on an external address signal, or may be generated internally by the memory device itself, for example, during a self refresh mode.

The wordline enable signal PXB and the wordline disable signal PXIB are signals for controlling the operation of the sub-wordline driver 1300 that is configured to drive the sub-wordline SWL. The one or more timing control signals PTCB are for controlling timings of the wordline enable signal PXB and the wordline disable signal PXIB.

The sub-wordline SWL may be activated or enabled by controlling an operation of the sub-wordline driver 1300 if the sub-wordline SWL is selected based on the decoded address signal DRA and the one or more selection signals SEL. The wordline driver 1000 activates the sub-wordline SWL by charging the sub-wordline SWL in response to the wordline enable signal PXB, thereby adjusting the voltage level of the sub-wordline SWL.

The sub-wordline SWL may be deactivated or disabled by controlling the operation of the sub-wordline driver 1300 if the sub-wordline SWL is not selected based on the decoded address signal DRA and the one or more selection signals SEL.

As such, a selected sub-wordline may be activated and an unselected sub-wordline may be deactivated, using the wordline enable signal PXB and the wordline disable signal PXIB.

The pre-driver 1100 of the wordline driver 1000 controls the timings of the wordline enable signal PXB and the wordline disable signal PXIB in response to the one or more timing control signals PTCB.

In an example embodiment, the wordline driver 1000 may generate the wordline enable signal PXB and the wordline disable signal PXIB by performing a logical operation upon the one or more selection signals SEL and the decoded address signal DRA, and then the wordline driver 1000 may control the timings of the wordline enable signal PXB and the wordline disable signal PXIB using the one or more timing control signals PTCB.

In another example embodiment, the wordline driver 1000 may simultaneously generate and control the timings of the wordline enable signal PXB and the wordline disable signal PXIB, by performing logical operation upon the one or more selection signals SEL, the decoded address signal DRA, and the one or more timing control signals PTCB.

The pre-driver 1100 may control independently the wordline enable signal PXB and the wordline disable signal PXIB in response to the one or more timing control signals PTCB. The one or more timing control signals PTCB may include a plurality of signals as will be described with reference to FIGS. 2 and 3.

The transmission circuit 1200 transmits the wordline enable signal PXB and the wordline disable signal PXIB, which are generated by the pre-driver 1100, to the sub-wordline driver 1300. The transmission circuit 1200 may include a plurality of transmission lines which are connected, for example, by via contacts. The transmission circuit 1200 may further include a repeater which is for amplifying the wordline enable signal PXB and the wordline disable signal PXIB that are to be transmitted through the transmission lines. In some example embodiments, the transmission circuit 1200 may transmit the amplified wordline enable signal PXID to the sub-wordline driver 1300 using the repeater, and may transmit the wordline disable signal PXIB without using a repeater (or without amplification).

The sub-wordline driver 1300 may be activated in response to the normal wordline enable signal NWEIB. As will be described with reference to FIG. 10, for a memory device having a hierarchical wordline structure in which a plurality of sub-wordline drivers are activated simultaneously in response to the same normal wordline enable signal NWEIB, each of the sub-wordline drivers may select one sub-wordline SWL based on the wordline enable signal PXB and the wordline disable signal PXIB, and may adjust voltage levels of the selected sub-wordlines and the unselected sub-wordlines.

The sub-wordline driver 1300 may activate the sub-wordline SWL by charging the sub-wordline up to a relatively high voltage level, and may deactivate the sub-wordline SWL by stabilizing the sub-wordline to a relatively low voltage level.

Figure 2:
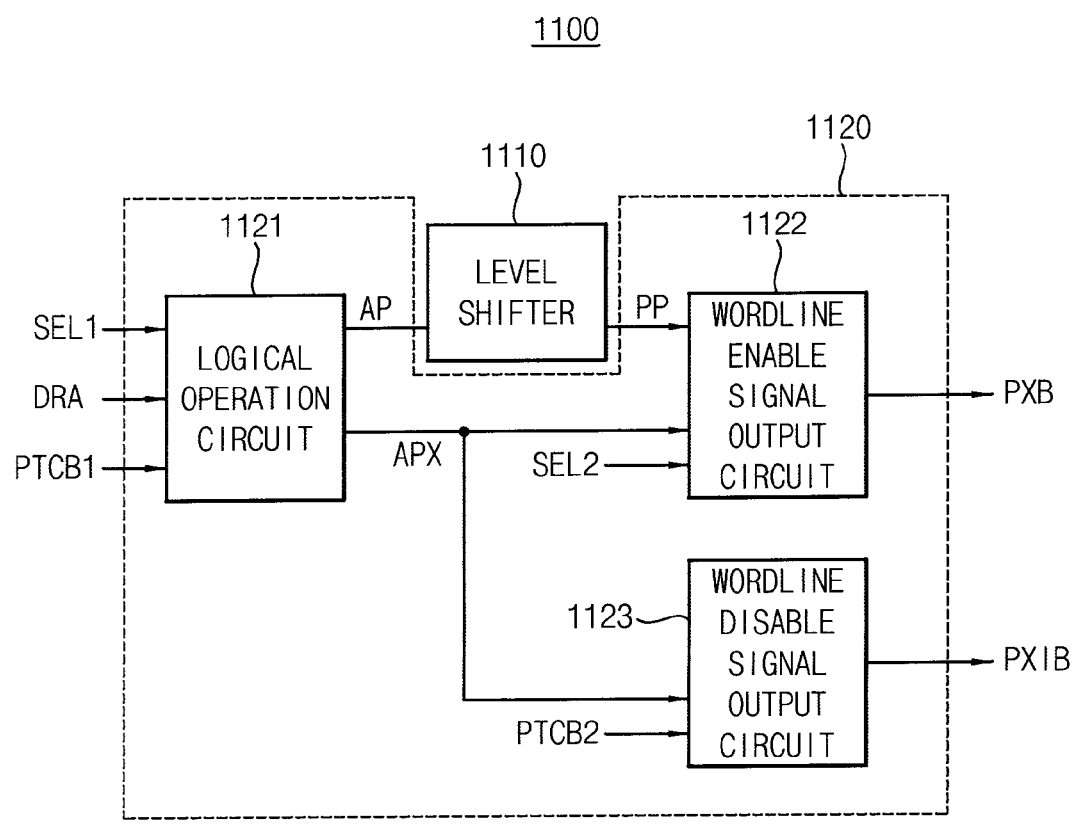
FIG. 2 is a block diagram illustrating an example of a pre-driver in the wordline driver of FIG. 1.

FIG. 2 is a block diagram illustrating an example of a pre-driver in the wordline driver of FIG. 1.

Referring to FIG. 2, the pre-driver 1100 may include a level shifter 1110 and a timing control circuit 1120.

The one or more selection signals SEL of FIG. 1 may include a first selection signal SEL1 and a second selection signal SEL2 of FIG. 2. The one or more timing control signals PTCB of FIG. 1 may include a first timing control signal PTCB1 and a second timing control signal PTCB2 of FIG. 2.

The pre-driver 1100 may include the level shifter 1110 for controlling a voltage level of a first combination signal AP which is generated by performing a logical operation upon the first timing control signal PTCB1 and the first selection signal SEL1. In some example embodiments, the level shifter 1110 may be omitted.

The timing control circuit 1120 generates the wordline enable signal PXB and the wordline disable signal PXIB based on the first selection signal SEL1, the second selection signal SEL2, the decoded address signal DRA, the first timing control signal PTCB 1 and the second timing control signal PTCB2. The SEL, DRA, and PTCB signals may be generated, for example, by a controller (not shown), or internally in a memory device. For example, in one embodiment, each signal may have an enabled and non-enabled state (e.g., high and low) which may be controlled independently of the other signals by a controller. The timing control circuit 1120 controls logic level transitions of the wordline enable signal PXB and the wordline disable signal PXIB in response to the first timing control signal PTCB 1 and the second timing control signal PTCB2.

The timing control circuit 1120 may include a logical operation circuit 1121, a wordline enable signal output circuit 1122 and a wordline disable signal output circuit 1123.

The logical operation circuit 1121 generates the first combination signal AP and a second combination signal APX by performing a logical operation upon the first selection signal SEL1, the decoded address signal DRA and the first timing control signal PTCB1.

The wordline enable signal output circuit 1122 provides the wordline enable signal PXB based on the second selection signal SEL2, the first combination signal AP and the second combination signal APX. In some example embodiments, the first combination signal AP may be replaced by a level shifter output signal PP of which the voltage level is controlled by the level shifter 1110. In an example embodiment in which the level shifter 1110 is omitted, the first combination signal AP may be provided to the wordline enable signal output circuit 1122 instead of the level shifter output signal PP. In one embodiment, level shifter 1110 includes a power supply Vpp that is at a higher voltage level than a supply voltage supplied to logical operation circuit 1121. As a result, Vpp may be used to drive wordline enable signal output circuit 1122.

The wordline disable signal output circuit 1123 provides the wordline disable signal PXIB based on the second combination signal APX and the second timing control signal PTCB2.

As described above, the pre-driver 1100 may generate the wordline enable signal PXB and the wordline disable signal PXIB using the wordline enable signal output circuit 1122 and the wordline disable signal output circuit 1123. Thus, in one embodiment, through the use of separate circuits and different timing control signals, pre-driver 1100 may control independently transition time points of the wordline enable signal PXB and the wordline disable signal PXIB.

Figure 3:
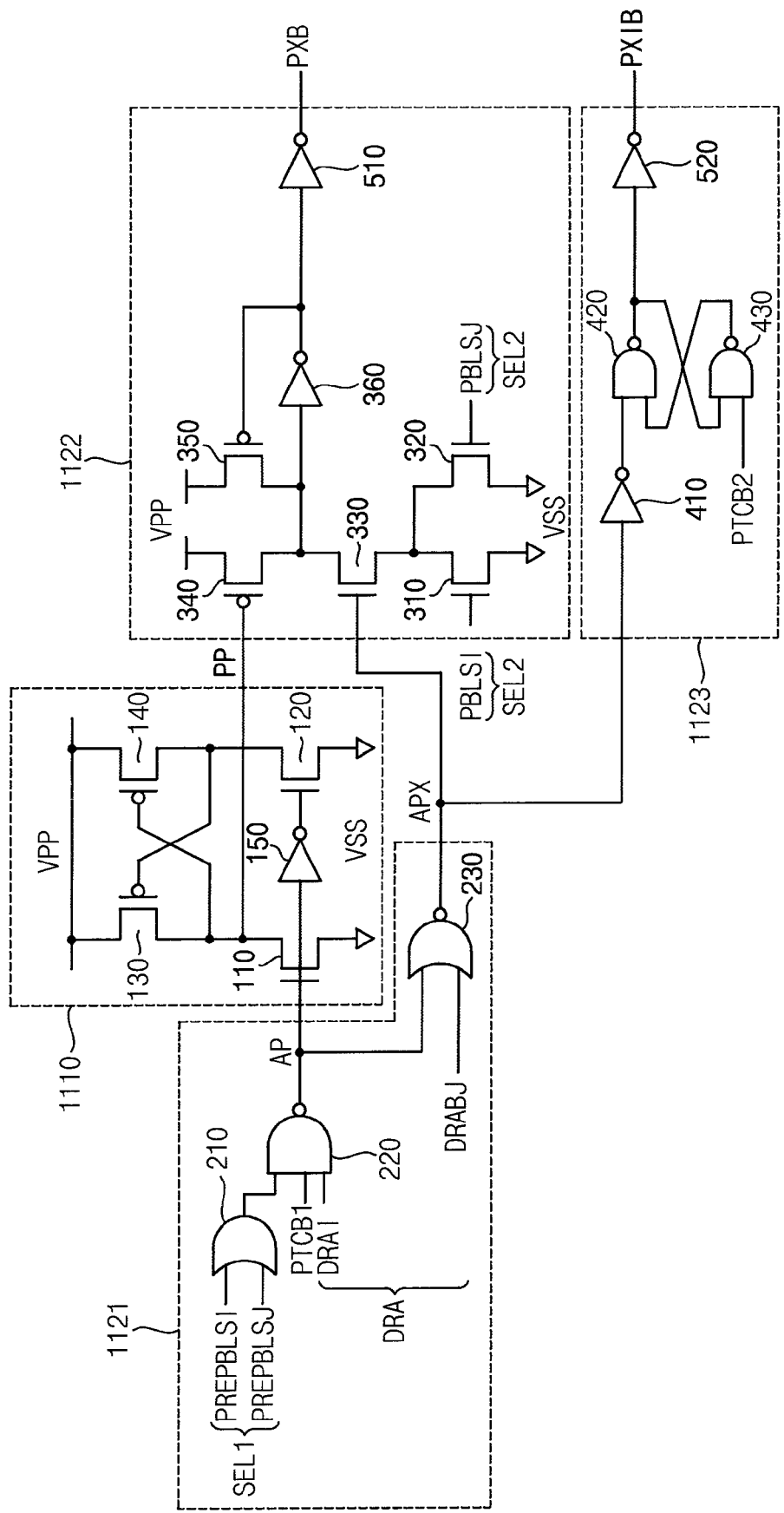
FIG. 3 is a circuit diagram illustrating an example of the pre-driver of FIG. 2.

FIG. 3 is a circuit diagram illustrating an example of the pre-driver of FIG. 2.

Referring to FIG. 3, as described above, the pre-driver 1100 may include the level shifter 1110 and the timing control circuit 1120. The timing control circuit 1120 may include the logical operation circuit 1121, the wordline enable signal output circuit 1122, and the wordline disable signal output circuit 1123.

The one or more selection signals SEL of FIG. 1 may include the first selection signal SEL1 and the second selection signal SEL2 of FIG. 3. The first selection signal SEL1 may include a first block selection signal PREPBLSI and a second block selection signal PREPBLSJ. The decoded address signal DRA may include a first transmission line selection signal DRAI and a second transmission line selection signal DRABJ.

The first block selection signal PREPBLSI and the second block selection signal PREPBLSJ are transmitted from a block selection circuit (not shown), and may be signals for selecting one memory block among a plurality of memory blocks.

The first transmission line selection signal DRAI and the second transmission line selection signal DRABJ may be signals for selecting one transmission line from the plurality of transmission lines connected to respective sub-wordlines. For example of the memory device having the hierarchical wordline structure, the pre-drivers such as illustrated in FIG. 3 may be assigned to the respective sub-wordlines and each of the assigned pre-drivers may generate and transmit the wordline enable signal PXB and the wordline disable signal PXIB to the corresponding sub-wordline driver 1300 through the transmission lines. The first transmission line selection signal DRAI and the second transmission line selection signal DRABJ may be signals for selecting one sub-wordline driver among the plurality of sub-wordline drivers, which are selected simultaneously based on the same normal wordline enable signal NWEIB, and for selecting one transmission line coupled to the selected sub-wordline driver.

The second selection signal SEL2 may include a third block selection signal PBLSI and a fourth block selection signal PBLSJ.

In one embodiment, the third block selection signal PBLSI and the fourth block selection signal PBLSJ may be delayed signals of the first block selection signal PREPBLSI and the second block selection signal PREPBLSJ, respectively. The memory device may perform a redundancy check operation during a time interval of delaying the first block selection signal PREPBLSI and the second block selection signal PREPBLSJ.

The one or more timing control signals PTCB of FIG. 1 may include the first timing control signal PTCB1 and the second timing control signal PTCB2 of FIG. 3.

The logical operation circuit 1121 may include a first logic gate 210, a second logic gate 220 and a third logic gate 230. The first logic gate 210 may be an OR gate. The second logic gate 220 may be a NAND gate, and the third logic gate 230 may be a NOR gate.

The first logic gate 210 performs an OR operation on the first block selection signal PREPBLSI and the second block selection signal PREPBLSJ. The second logic gate 220 generates the first combination signal AP by performing a NAND operation on the output signal of the first logic gate 210, the first timing control signal PTCB1 and the first transmission line selection signal DRAI. The third logic gate 230 generates the second combination signal APX by performing a NOR operation on the first combination signal AP and the second transmission line selection signal DRABJ.

The level shifter 1110 may include a first metal-oxide semiconductor (MOS) transistor 110, a second MOS transistor 120, a third MOS transistor 130, a fourth MOS transistor 140 and a first inverter 150. The first MOS transistor 110 and the second MOS transistor 120 may be N-type MOS (NMOS) transistors. The third MOS transistor 130 and the fourth MOS transistor 140 may be P-type MOS (PMOS) transistors.

In one embodiment, the first MOS transistor 110 and the third MOS transistor 130 are connected in series between a first power supply voltage VPP and a second power supply voltage VSS. The second MOS transistor 120 and the fourth MOS transistor 140 are connected in series between the first power supply voltage VPP and the second power supply voltage VSS. A gate node of the third MOS transistor 130 is coupled to a drain node of the fourth MOS transistor 140, and a gate node of the fourth MOS transistor 140 is coupled to a drain node of the third MOS transistor 130. The first inverter 150 is coupled between gate nodes of the first MOS transistor 110 and the second MOS transistor 120, thus the gate nodes of the first MOS transistor 110 and the second MOS transistor 120 may receive the first combination signal AP and an inversion signal thereof, respectively.

The level shifter 1110 receives the first combination signal AP through the gate node of the first MOS transistor 110, and provides the level shifted signal PP through a drain node of the first MOS transistor 110.

The wordline enable signal output circuit 1122 may include a fifth MOS transistor 310, a sixth MOS transistor 320, a seventh MOS transistor 330, a eighth MOS transistor 340, a ninth MOS transistor 350 and a second inverter 360.

In one embodiment, the fifth MOS transistor 310 and the sixth MOS transistor 320 are connected in parallel between the seventh MOS transistor 330 and the second power supply voltage VSS, and receive the third block selection signals PBLSI and fourth block selection signals PBLSJ, respectively, through gate nodes.

The wordline enable signal output circuit 1122 controls the timing and the logic level of the wordline enable signal PXB in response to levels of signals: the output signal PP of the level shifter 1110, the second combination signal APX, the third block selection signal PBLSI and the fourth block selection signal PBLSJ.

The wordline disable signal output circuit 1123 may include a third inverter 410, a fourth logic gate 420 and a fifth logic gate 430.

The third inverter 410 may invert the second combination signal APX. The fourth logic gate 420 and fifth logic gate 430 may latch the inverted second combination signal APX and the second timing control signal PTCB2.

The wordline enable signal output circuit 1122 and the wordline disable signal output circuit 1123 may include output inverters 510 and 520, respectively. The output inverters 510 and 520 may be final drivers that stabilize and provide the wordline enable signal PXB and the wordline disable signal PXIB with amplification, respectively.

Figure 4:
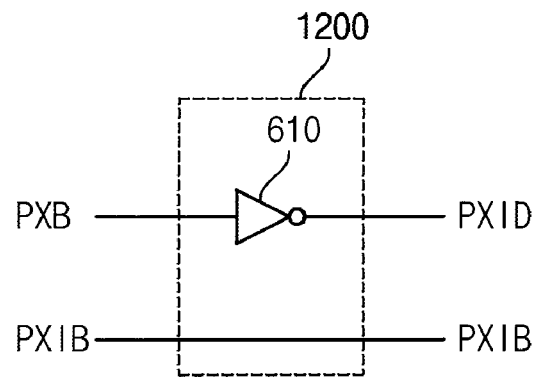
FIG. 4 is a circuit diagram illustrating an example of a transmission circuit in the wordline driver of FIG. 1.

FIG. 4 is a circuit diagram illustrating an example of the transmission circuit in the wordline driver of FIG. 1.

Referring to FIG. 4, the transmission circuit 1200 may include a repeater 610 which controls the voltage level of the wordline enable signal PXB. The transmission circuit 1200 may include other elements (not shown), but as described below, in one embodiment, the transmission circuit 1200 is provided between the pre-driver circuit 1100 and the sub-wordline driver 1300, such that the wordline enable signal PXB transits through a repeater 610 before being input to sub-wordline driver, but wordline disable signal PXIB does not transit through any repeater, and thus is not amplified, prior to being input to sub-wordline driver.

As will be described with reference to FIGS. 9 and 10, the pre-driver 1100 may be located on a row decoder area near to a memory cell array, and the sub-wordline driver 1300 may be located adjacent to a corresponding sub-cell array in the memory cell array. In this case, for compensating signal attenuation on the transmission lines, the transmission circuit 1200 may include the repeater 610 for amplifying the wordline enable signal PXB to transmit the amplified wordline enable signal PXID to the sub-wordline driver 1300. In contrast, the wordline disable signal PXIB may be transmitted without amplification or without using a repeater, to the sub-wordline driver 1300. Conventionally, the timings of the wordline enable signal PXB and the wordline disable signal PXIB are controlled based on the same signals; thus, both of a wordline enable signal and a wordline disable signal are transmitted to a sub-wordline driver via respective repeaters. Different from the conventional configuration, the wordline driver 1000 of FIG. 1 controls independently transition time points of the wordline enable signal PXB (or the amplified wordline enable signal PXID) and the wordline disable signal PXIB in response to the one or more selection signals SEL and the one or more timing control signals PTCB.

With respect to the wordline disable signal PXIB, timing control is more important than transmission speed. Thus the configuration and the method described referring to FIGS. 1 to 4 may be adopted to effectively control the timings of the wordline enable signal PXB and the wordline disable signal PXIB. The pre-driver 1100 may be located in the row decoder area and may directly drive the wordline disable signal PXIB without using a repeater. The repeaters for amplifying the wordline enable signals PXB may be located in the conjunction area between the plurality of sub-cell arrays. A layout margin of the memory device may be increased by removing surplus repeaters from the conjunction area, which are for amplifying the wordline disable signal PXIB. Since such improvement in the layout margin leads to a higher driving capacity of the repeaters, performance of the memory device adopting the wordline driver according to such example embodiments may be improved.

Figure 5:
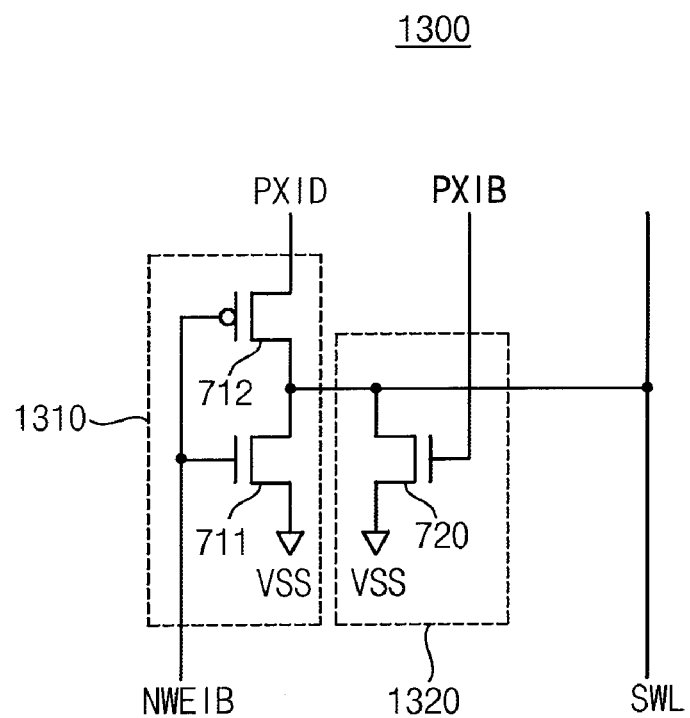
FIG. 5 is a circuit diagram illustrating an example of a sub-wordline driver in the wordline driver of FIG. 1.

FIG. 5 is a circuit diagram illustrating an example of a sub-wordline driver in the wordline driver of FIG. 1.

Referring to FIG. 5, the sub-wordline driver 1300 includes a wordline activation circuit 1310 and a wordline deactivation circuit 1320.

The wordline activation circuit 1310 increases the voltage level of the sub-wordline SWL up to the first power supply voltage VPP while the amplified wordline enable signal PXID has an active logic level. The active logic level of the amplified wordline enable signal PXID may be a logic high level, and the inactive logic level of the amplified wordline enable signal PXID may be a logic low level. When the repeater 610 on the transmission path is an inverter type, the amplified wordline enable signal PXID provided to the wordline activation circuit 1310 may be substantially opposite to the logic level of the wordline enable signal PXB that is provided from the pre-driver 1100. When the repeater 610 is a buffer type, the amplified wordline enable signal PXID may be substantially equal to the logic level with the logic level of the wordline enable signal PXB that is provided from the pre-driver 1100. The wordline activation circuit 1310 may be an inverter configuration, in which the wordline activation circuit 1310 drives the sub-wordline SWL by transiting the normal wordline enable signal NWEIB while the amplified wordline enable signal PXID has an active logic level. When the sub-wordline SWL is activated, the amplified wordline enable signal PXID may be at a logic high level and the normal wordline enable signal NWEIB may be at a logic low level. The logic high level of the amplified wordline enable signal PXID may be an increased voltage level that is higher than a power supply voltage for other circuitry in the memory device, to rapidly activate the sub-wordline SWL.

The wordline deactivation circuit 1320 stabilizes the voltage level of the sub-wordline SWL to the second power supply voltage VSS while the wordline disable signal PXIB has an active logic level. For example, the second power supply voltage VSS may be a ground voltage. When the sub-wordline SWL is to be deactivated, the sub-wordline SWL may be floated since the amplified wordline enable signal PXID has a logic low level and transistors 711 and 712 of the wordline activation circuit 1310 are turned off. In this case, the voltage level of the sub-wordline SWL may be stabilized to the second power supply voltage VSS since the transistor 720 of the wordline deactivation circuit 1320 is turned on by the wordline disable signal PXIB. As such, the voltage level of the sub-wordline SWL is stabilized to the second power supply voltage VSS when a conduction path is formed between the sub-wordline SWL and the ground voltage by turning on the transistor 720 of wordline deactivation circuit 1320.

As described above, the sub-wordline driver 1300 may drive the sub-wordline SWL by controlling the normal wordline enable signal NWEIB, the amplified wordline enable signal PXID and the wordline disable signal PXIB. Moreover, the pre-driver 1100 may independently drive the timings of the wordline enable signal PXB, which may be amplified by the transmission circuit 1200 into the amplified wordline enable signal PXID, and the wordline disable signal PXIB using the one or more timing control signals PTCB.

Figure 6:
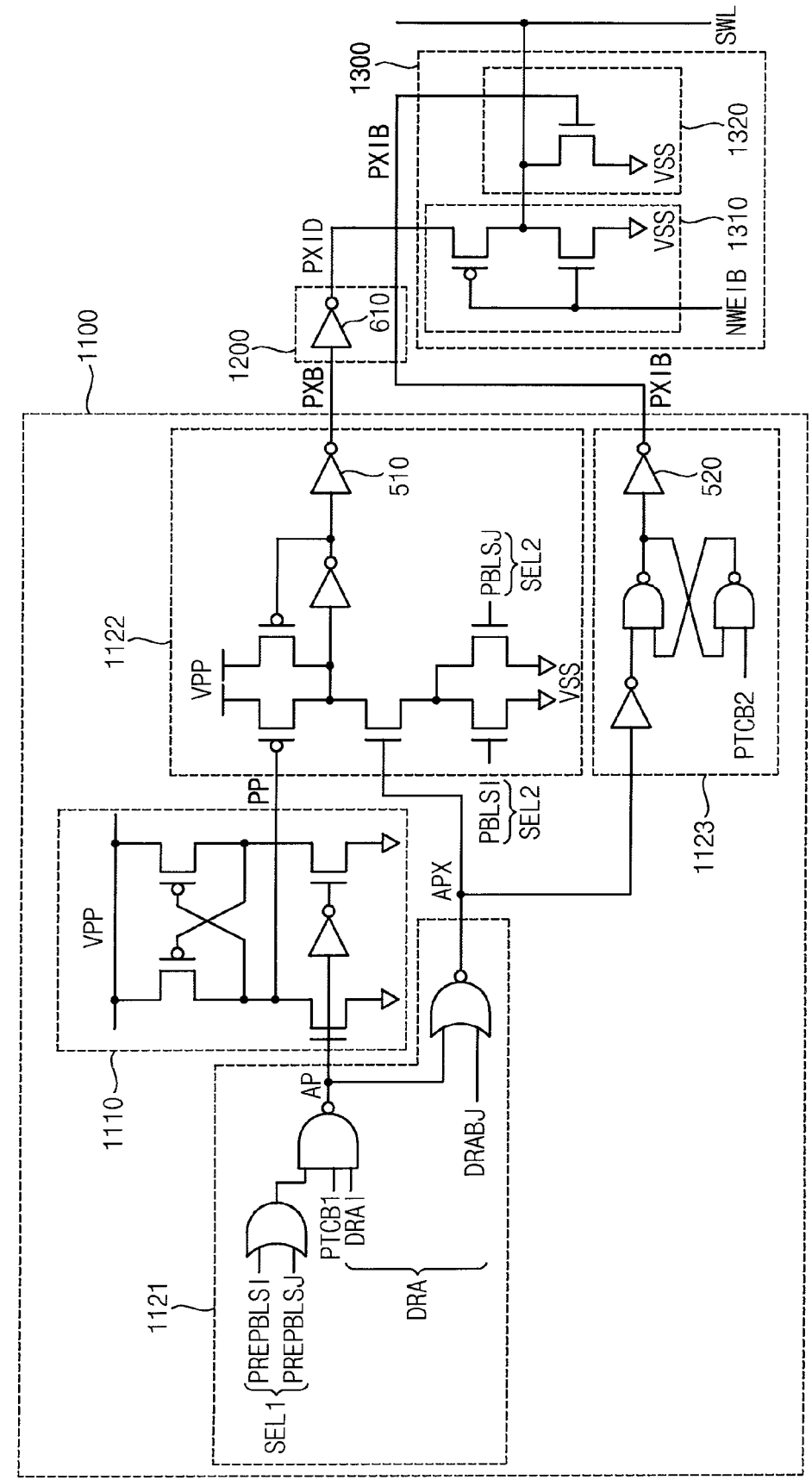
FIG. 6 is a circuit diagram illustrating an example of the wordline driver of FIG. 1.

The FIG. 6 is a circuit diagram illustrating an example of the wordline driver of FIG. 1.

Structures and operations of a pre-driver 1100, a transmission circuit 1200 and a sub-wordline driver 1300 of the wordline driver 1000 of FIG. 6 are similar to structures and operations of the pre-driver 1100 of FIG. 3, the transmission circuit 1200 of FIG. 4 and the sub-wordline driver 1300 of FIG. 5, respectively, and thus repeated descriptions are omitted.

Referring to FIG. 6, the wordline driver 1000 may include the repeater 610 between the wordline enable signal output circuit 1122 and the sub-wordline driver 1300. In an example embodiment, the repeater 610 may be located in the conjunction area inside the memory cell array, as illustrated in FIGS. 9 and 10. The wordline disable signal PXIB may be provided to the sub-wordline driver 1300 such that the pre-driver 1100 directly drives the wordline disable signal PXIB without using a repeater.

Figure 7:
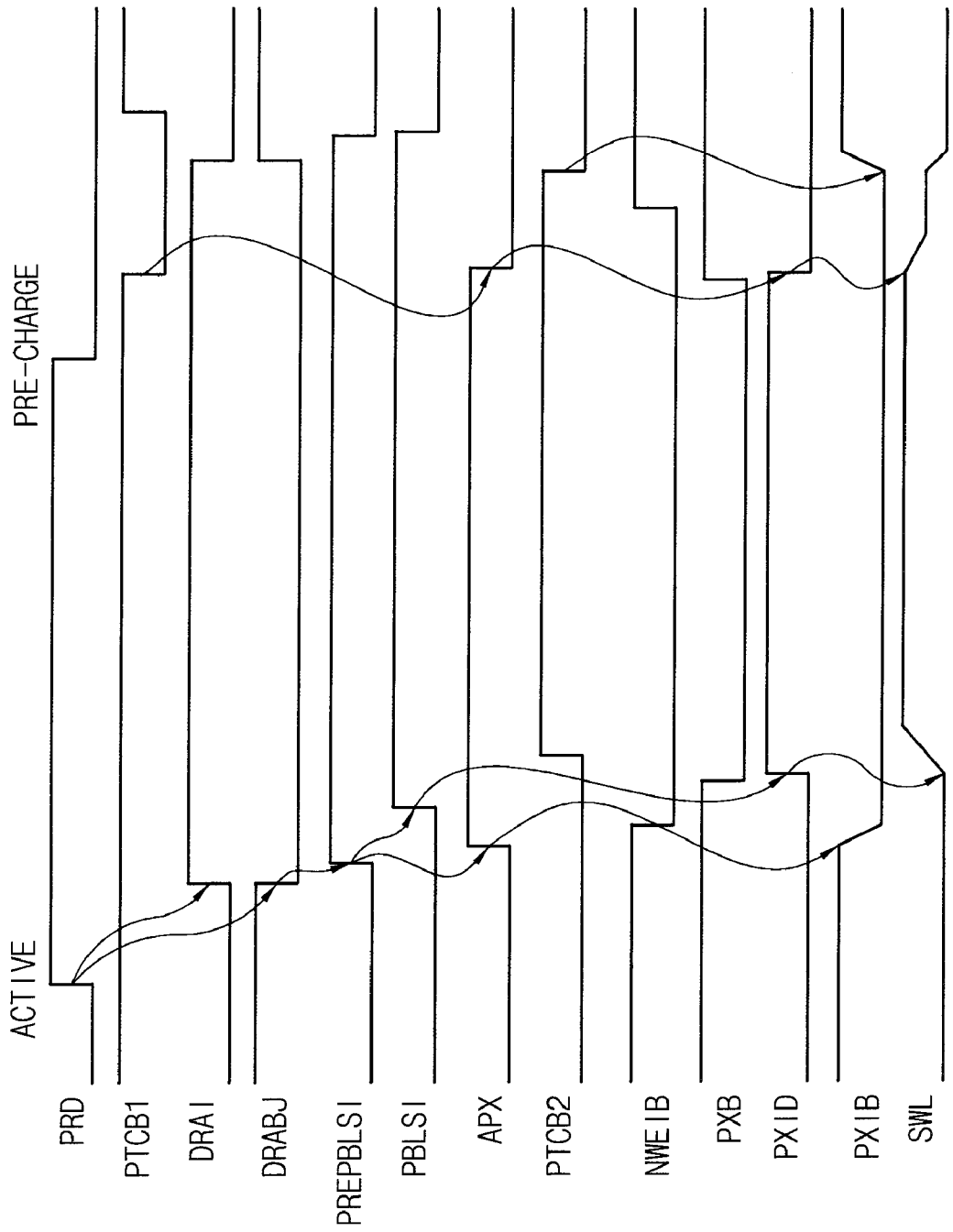
FIG. 7 is a timing diagram illustrating an operation of a wordline driver according to some example embodiments.

FIG. 7 is a timing block diagram illustrating an operation of a wordline driver according to some example embodiments.

Referring to FIG. 7, the memory device may activate the selected sub-wordline SWL while a mode signal PRD has a logic high level, and may deactivate the selected sub-wordline SWL while the mode signal PRD has a logic low level. The mode signal PRD may be provided from a memory controller, and indicates an active mode or a pre-charge mode depending on the logic level of the mode signal PRD.

Hereinafter, the operation of activating the sub-wordline SWL will be described.

When the mode signal PRD is transited from logic low level to logic high level, the first transmission line selection signal DRAI and the second transmission line selection signal DRABJ are transited, and then the first block selection signal PREPBLSI is transited. After transiting the block selection signal PREPBLSI and then, after some delay time, the third block selection signal PBLSI is transited.

The first transmission line selection signal DRAI and the second transmission line selection signal DRABJ, the normal wordline enable signal NWEIB, the first to the fourth block selection signals PREPBLSI, PREPBLSJ, PBLSI and PBLSJ may be transited according to a logic level transition of the mode signal PRD by other circuits such as a memory controller, address decoders and other peripheral circuits, that are located outside of the wordline driver 1000 of FIG. 6.

According to the logic level transition of the second transmission line selection signal DRABJ, the logic level of the second combination signal APX is transited, and then the wordline disable signal PXIB is transited to a logic low level or an inactive logic level according to the logic level transition of the second combination signal APX.

The amplified wordline enable signal PXID follows the wordline enable signal PXB and is transited to a logic high level or an active logic level according to a logic level transition of the third block selection signal PBLSI.

For activating the sub-wordline SWL, the amplified wordline enable signal PXID may be activated after deactivating the wordline disable signal PXIB.

Hereinafter, the operation of deactivating the sub-wordline SWL will be described.

When the mode signal PRD is transited from a logic high level to a logic low level, the first transmission line selection signal DRAI, the second transmission line selection signal DRABJ, the first block selection signal PREPBLSI and the third block selection signal PBLSI are transited in the substantially same way of activating the sub-wordline SWL.

However, the first timing control signal PTCB1 is transited from a logic high level to a logic low level before the first transmission line selection signal DRAI, the second transmission line selection signal DRABJ, the first block selection signal PREPBLSI and the third block selection signal PBLSI are transited, and then the second combination signal APX may be transited from a logic high level to a logic low level.

The amplified wordline enable signal PXID may be transited to a logic low level or an inactive logic level in response to a logic level transition of the second combination signal APX.

When the second timing control signal PTCB2 is transited from a logic high level to a logic low level, the wordline disable signal PXIB may be transited to a logic high level or an active logic level.

In an example embodiment, for deactivating the sub-wordline SWL, the amplified wordline enable signal PXID may be deactivated first and then the wordline disable signal PXIB may be activated second using the first timing control signal PTCB1 and second timing control signal PTCB2.

When deactivating the sub-wordline SWL, power consumption may be increased due to a short current if the wordline activation circuit 1310 and the wordline deactivation circuit 1320 are turned on simultaneously. Such short current may be prevented when the amplified wordline enable signal PXID is deactivated firstly and then the wordline disable signal PXIB is activated after some delay time.

The timings of the amplified wordline enable signal PXID and the wordline disable signal PXIB, which are controlled using the first timing control signal PTCB1 and the second timing control signal PTCB2, may be adjusted based on operation characteristics of components in the sub-wordline driver 1300.

Figure 8:
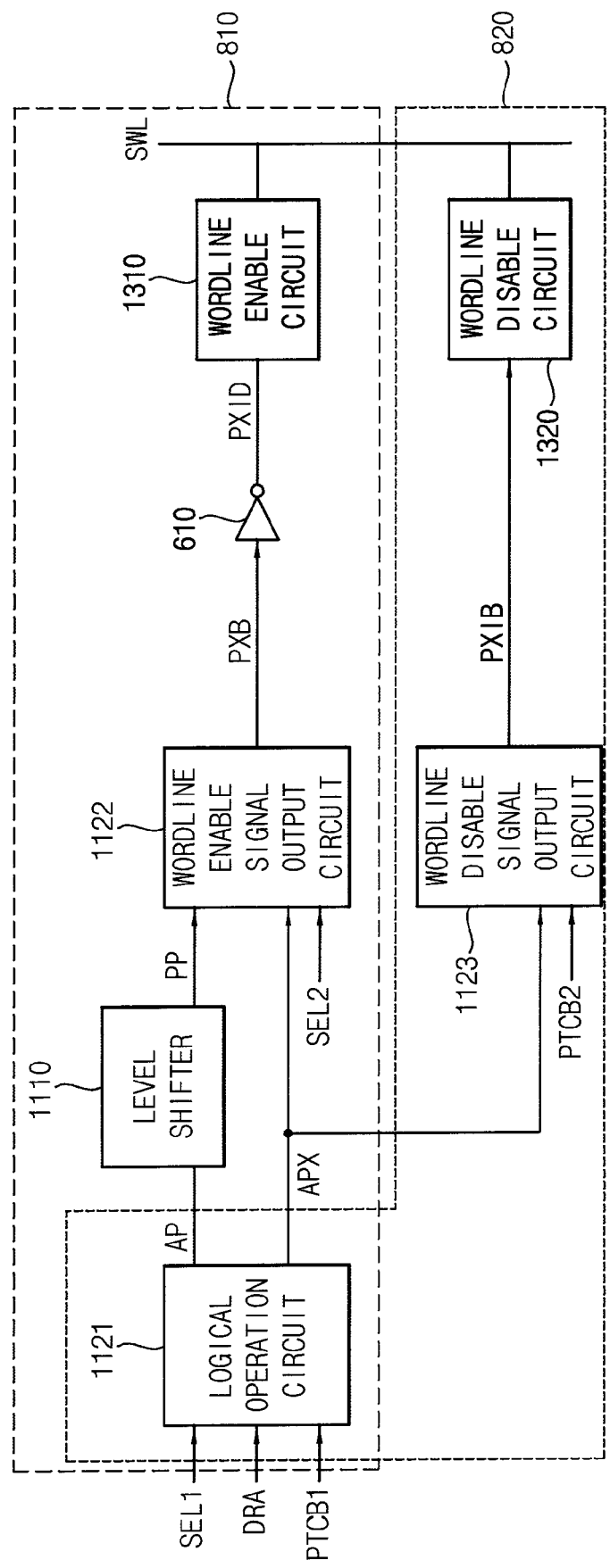
FIG. 8 is a diagram illustrating signal paths of a wordline driver according to some example embodiments.

FIG. 8 is a diagram illustrating signal paths of a wordline driver according to some example embodiments.

Referring to FIG. 8, a wordline driver 1000a includes a wordline enable path 810 and a wordline disable path 820.

The wordline enable path 810 may include the logical operation circuit 1121, the level shifter 1110, the wordline enable signal output circuit 1122, the repeater 610, and the wordline activation circuit 1310. In an example embodiment, the level shifter 1110 may be omitted from the wordline enable path 810.

In the wordline enable path 810, the wordline enable signal PXB and the amplified wordline enable signal PXID are generated by performing a logical operation upon the first selection signal SEL1, the second selection signal SEL2, the decoded address signal DRA and the first timing control signal PTCB1. The timing of the amplified wordline enable signal PXID may be controlled in response to the first timing control signal PTCB1.

The wordline disable path 820 may include the logical operation circuit 1121, the wordline disable signal output circuit 1123 and the wordline deactivation circuit 1320.

In the wordline disable path 820, the wordline disable signal PXIB is generated based on the first selection signal SEL1, the decoded address signal DRA, the first timing control signal PTCB1, and the second timing control signal PTCB2. As such, the timing of the wordline disable signal PXIB is controlled independently of the timing of the wordline enable signal PXID.

Thus, the transition time point of the amplified wordline enable signal PXID and the transition time point of the wordline disable signal PXIB may be controlled independently.

Figure 9:
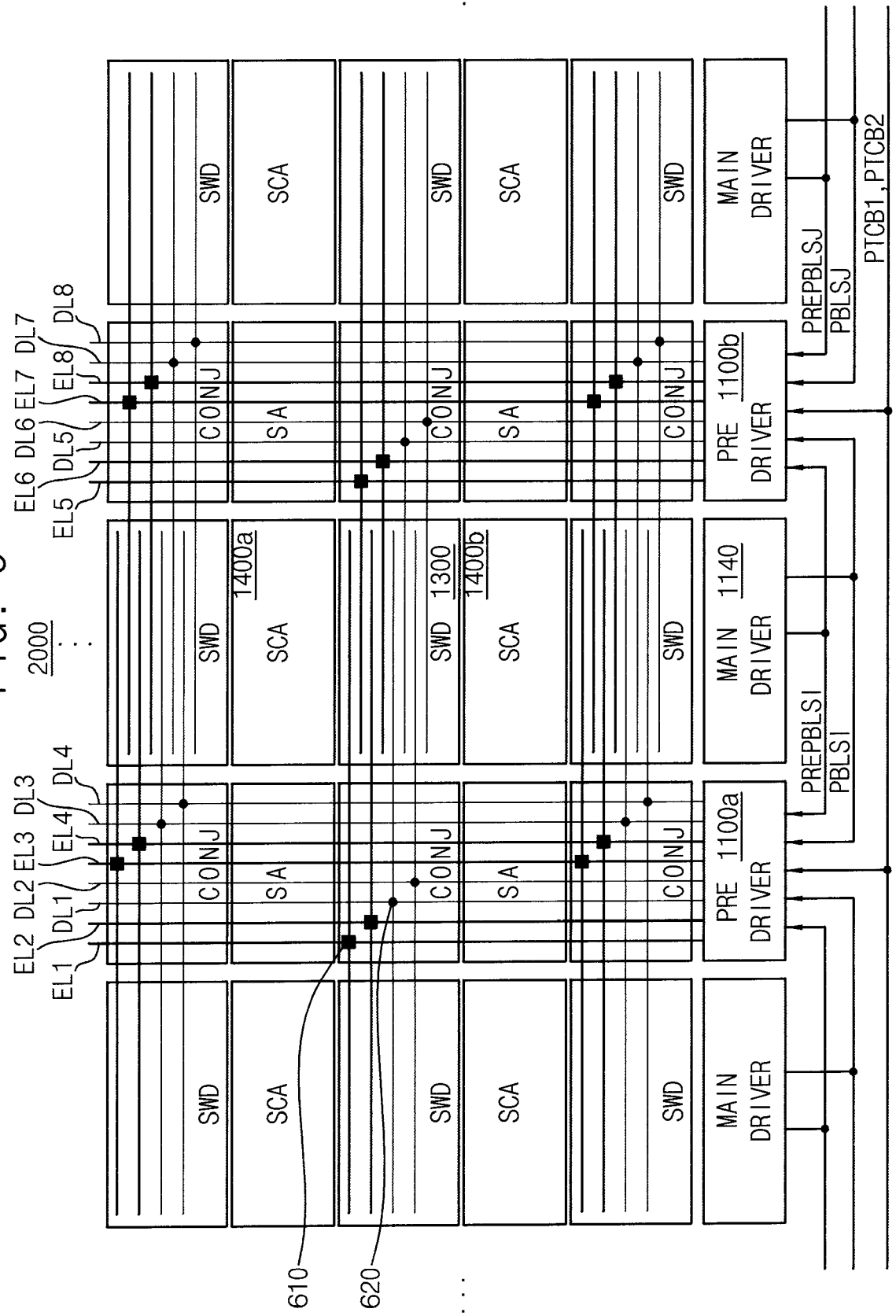
FIG. 9 is a diagram illustrating a layout of a memory device according to some example embodiments.

FIG. 9 is a diagram illustrating a layout of a memory device according to some example embodiments. A hierarchical wordline structure including normal wordlines and sub-wordlines is omitted in FIG. 9, which will be described with reference to FIG. 10.

Referring to FIG. 9, a memory device 2000 may include a memory cell array partitioned into a plurality of sub-cell array areas SCA, a plurality of conjunction areas CONJ, a plurality of sub-wordline areas SWD, and a plurality of sense amplifier areas SA. Main drivers 1140, pre-drivers 1100a and 1100b may be located on the row decoder areas near to the memory cell array.

The transmission circuit may include transmission lines EL1 to EL8, DL1 to DL8, repeaters 610 and via contacts 620. The transmission lines EL and DL are coupled to respective sub-wordlines coupled to the sub-cell arrays. The repeaters 610 and the via contacts 620 are located in a conjunction area CONJ, and the via contact 620 indicates interlayer conductive element for connecting a row direction line with a column direction line in different metal layers.

The main driver 1140 and the pre-drivers 1100a and 1100b may be arranged repeatedly in the row decoder area near to the memory cell array, according to partitions of the sub-cell arrays. Each of the main drivers generates the normal wordline enable signal NWEIB for selecting a normal wordline. The pre-drivers 1100a and 1100b generate the wordline enable signal PXB and the wordline disable signal PXIB for selecting one sub-wordline among a plurality of sub-wordlines branched off from the selected normal wordlines. The block selection signals PREPBLSI, PREPBLSJ, PBLSI and PBLSJ which are provided from the main driver 1140 to the pre-drivers 1100a and 1100b may be activated when the normal wordline corresponding to the block selection signals is selected.

As described above, the amplified wordline enable signal PXID which is generated by amplifying the wordline enable signal PXB in the repeater 610 may be provided to the sub-wordline driver 1300. The wordline disable signal PXIB may be provided through, for example, the via contacts 620 and may be provided directly without amplification. Since timing is more important than transmission speed in case of the wordline disable signal PXIB, the above described configuration and method may be adopted for readily controlling the timings of the wordline disable signal PXIB. Furthermore the pre-drivers 1100a and 1100b located in the row decoder area may directly drive the wordline disable signal PXIB without using a repeater, thereby improving an entire layout margin of the memory device 2000.

As illustrated in FIG. 9, the repeaters 610 may be located in the conjunction areas CONJ between the sub-cell arrays SCA and the sub-wordline areas SWD. With respect to the sub-wordline driver 1300 corresponding to a sub-cell array 1400a, some of wordline enable signals and wordline disable signals may be provided from the left-sided lines EL1 EL2, DL1 and DL2 and other the wordline enable signals and the wordline disable signals may be provided from the right-sided lines EL5, EL6, DL5 and DL6. As illustrated in FIG. 9, the repeaters 610 located in the conjunction area CONJ may be arranged such that one of repeaters for one transmission line may be skipped every two sub-wordline drivers, by adopting a configuration of receiving the wordline enable signals and the wordline disable signals from both of the left and right sides of the corresponding sub-wordline driver.

Figure 10:
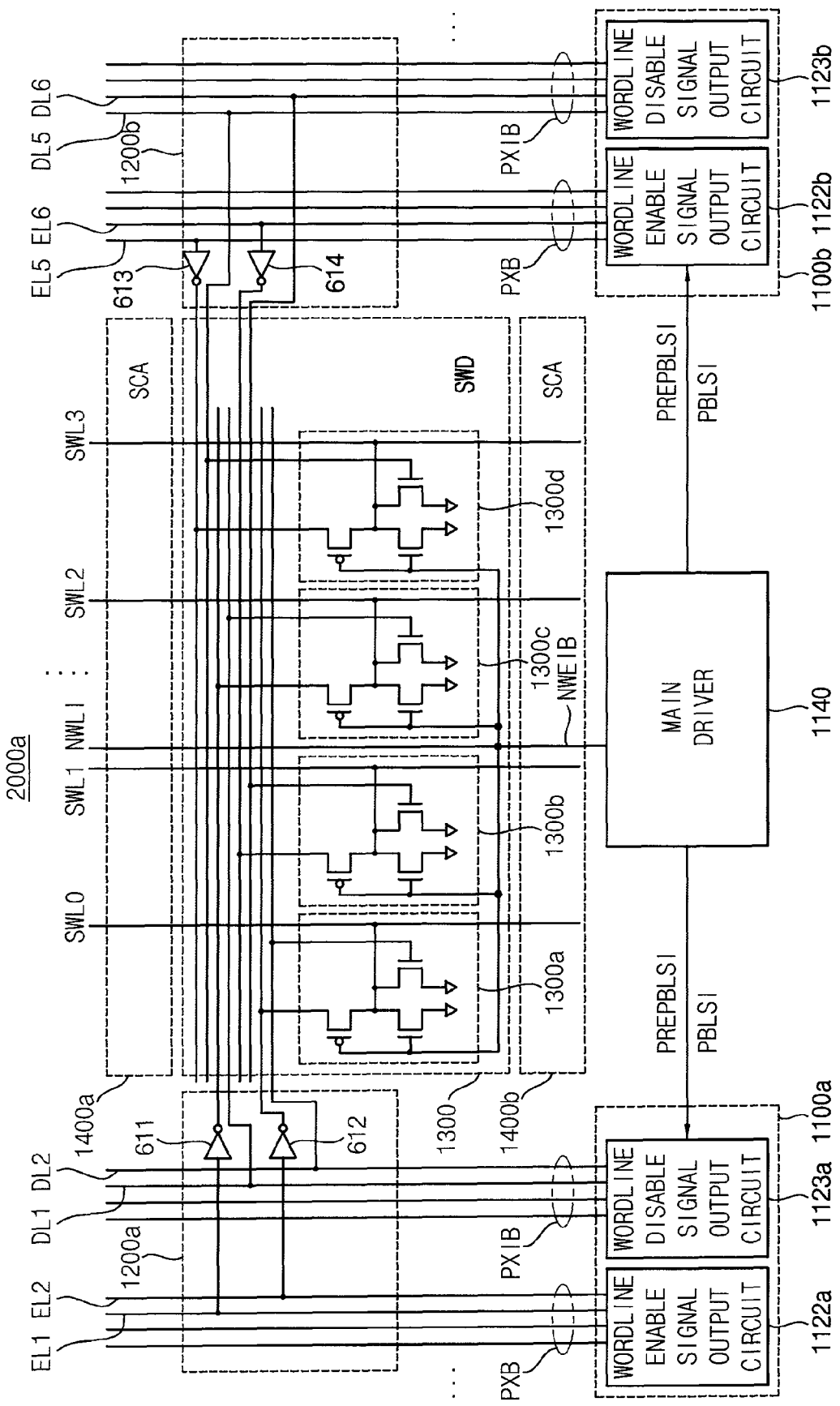
FIG. 10 is a diagram illustrating an example of a connection relationship of the memory device of FIG. 9.

FIG. 10 is a diagram illustrating an example of a connection relationship of the memory device of FIG. 9.

For convenience of description, a portion of the memory device of FIG. 9 is illustrated in FIG. 10. Illustrated in FIG. 10 are one main driver 1140, one sub-wordline driver 1300, one left-sided pre-driver 1100a for driving the even numbered sub-wordlines SWL0 and SWL2, one right-sided pre-driver 1100b for driving the odd numbered sub-wordlines SWL1 and SWL3, one left-sided conjunction area 1200a including the repeaters 611 and 612 for amplifying the signal PXB provided from the left side, and one right-sided conjunction area 1200b including the repeaters 613 and 614 for amplifying the signal PXB provided from the right side.

The descriptions of FIG. 10 repeated with respect to FIG. 9 will be omitted.

Referring to FIG. 10, an example of the hierarchical wordline structure in which four sub-wordlines SWL0, SWL1, SWL2 and SWL3 are branched off from one normal wordline NWL1 is illustrated, however the number of the sub-wordlines corresponding to one normal wordline may be changed.

As described above, a configuration and a method in which the pre-drivers 1100a and 1100b directly drive the wordline disable signal PXIB without using a repeater may be adopted since the pre-drivers 1100a and 1100b control independently the transition time points of the wordline enable signal PXB (or the amplified wordline enable signal PXID) and the wordline disable signal PXIB in response to the one or more timing control signals PTCB. Thus, the transmission circuits 1200a and 1200b which are located in the conjunction area CONJ may include the repeaters 611, 612, 613 and 614 for amplifying the wordline enable signal PXB. The layout margin of the memory device 2000 may be increased by removing surplus repeaters from the conjunction areas CONJ, which are for amplifying the wordline disable signal PXIB, and thus the drive capacity of the repeaters 611, 612, 613 and 614 may be further improved by increasing the size of the repeaters 611, 612, 613 and 614.

A wordline driver and a memory device according to some example embodiments may be employed in various systems to reduce the number of logic gates needed for transmitting signals from a wordline driver to a wordline, to decrease power consumption and to improve drive capacity by independently controlling timings of the wordline enable signal and the wordline disable signal. The wordline driver and the memory device according to some example embodiments may be employed more effectively in various systems which include memory devices having a hierarchical wordline structure. The described embodiments may be employed in different types of memory systems, such as DRAM (including DDR and SDRAM), NAND flash and NOR flash, RRAM, PRAM, MRAM, or other memory systems. In addition, aspects of the disclosed embodiments may be used in systems such as microprocessor systems, digital signal processors, communication system processors, or other systems that use enable or disable signals, as well as in embedded memory systems.

The foregoing is illustrative of example embodiments and is not to be construed as limiting thereof. Although a few example embodiments have been described, those skilled in the art will readily appreciate that many modifications are possible in the example embodiments without materially departing from the novel teachings and advantages of the present inventive concept. Accordingly, all such modifications are intended to be included within the scope of the present inventive concept as defined in the claims. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A wordline driver comprising:
   a pre-driver configured to generate a wordline enable signal and a wordline disable signal based on one or more selection signals, one or more decoded address signals and one or more timing control signals;
   a transmission circuit configured to amplify the wordline enable signal and transmit the amplified wordline enable signal; and
   a sub-wordline driver configured to control a voltage level of a sub-wordline based on the amplified wordline enable signal and the wordline disable signal,
   wherein the sub-wordline driver is configured to deactivate the sub-wordline of the sub-wordline driver in response to the amplified wordline enable signal that is deactivated at a deactivation time point of a first timing control signal of the one or more timing control signals and to deactivate the sub-wordline in response to the wordline disable signal that is activated at a deactivation time point of a second timing control signal of the one or more timing control signals,
   wherein the sub-wordline is configured to be deactivated regardless of logic levels of the one or more decoded address signals,
   wherein the pre-driver is configured to control independently a transition time point for a deactivation of the amplified wordline enable signal and a transition time point for an activation of the wordline disable signal, in response to the first and second timing control signals, respectively, and
   wherein the wordline driver is configured to not use the at least one of the one or more timing control signals to control a transition time point for an activation of the amplified wordline enable signal and to control a transition time point for a deactivation of the wordline disable signal.

2. The wordline driver of claim 1, wherein the wordline driver is configured to enable the sub-wordline in response to the one or more decoded address signals, and to disable the sub-wordline in response to the first and second timing control signals.

3. The wordline driver of claim 1, wherein the pre-driver is configured to activate the sub-wordline by transiting the amplified wordline enable signal to an active logic level after transiting the wordline disable signal to an inactive logic level.

4. The wordline driver of claim 1, wherein the pre-driver is configured to deactivate the sub-wordline by transiting the wordline disable signal to an active logic level after transiting the amplified wordline enable signal to an inactive logic level, in response to the first and second timing control signals.

5. A wordline driver comprising:
   a pre-driver configured to generate a wordline enable signal and a wordline disable signal based on one or more selection signals, one or more decoded address signals and one or more timing control signals;
   a transmission circuit configured to amplify the wordline enable signal and transmit the amplified wordline enable signal; and
   a sub-wordline driver configured to control a voltage level of a sub-wordline based on the amplified wordline enable signal and the wordline disable signal,
   wherein the pre-driver includes:
      a logical operation circuit configured to generate a first combination signal and a second combination signal by performing a logical operation upon a first selection signal of the one or more selection signals, the one or more decoded address signals, and a first timing control signal of the one or more timing control signals;
      a wordline enable signal output circuit configured to provide the wordline enable signal based on a second selection signal of the one or more selection signals, the first combination signal and the second combination signal; and
      a wordline disable signal output circuit configured to provide the wordline disable signal based on the second combination signal and a second timing control signal of the one or more timing control signals.

6. The wordline driver of claim 5, wherein the wordline driver is configured to deactivate the amplified wordline enable signal at a deactivation time point of the first timing control signal of the one or more timing control signals and to activate the wordline disable signal at a deactivation time point of the second timing control signal of the one or more timing control signals, and wherein the deactivation time point of the second timing control signal is controlled independently of the first timing control signal.

7. The wordline driver of claim 1, wherein the transmission circuit includes a repeater configured to amplify the wordline enable signal and to transmit the amplified wordline enable signal to the sub-wordline driver.

8. The wordline driver of claim 1, wherein the sub-wordline driver includes:
   a wordline activation circuit configured to increase a voltage level of the sub-wordline up to a first power supply voltage while the amplified wordline enable signal has an active logic level; and
   a wordline deactivation circuit configured to stabilize the voltage level of the sub-wordline at a second power supply voltage while the wordline disable signal has an active logic level, the wordline deactivation circuit being turned on after the wordline activation circuit is turned off in response to the amplified wordline enable signal and the wordline disable signal.

9. The wordline driver of claim 8, wherein the voltage difference between the second power supply voltage and the first power supply voltage is greater than the voltage difference between the second power supply voltage and a third power supply voltage for other circuitry in the wordline driver.

10. The wordline driver of claim 1, wherein:
   the wordline driver is part of a plurality of sub-cell arrays coupled to a plurality of sub-wordlines and partitioned into a plurality of areas;
   the transmission circuit includes a repeater located in a conjunction area between the plurality of sub-cell arrays for amplifying the wordline enable signal to transmit the amplified wordline enable signal to the sub-wordline driver; and
   the wordline disable signal is configured to be transmitted to the sub-wordline driver without being amplified in a conjunction area.

* * * * *